United States Patent
Yoshida et al.

(10) Patent No.: US 8,203,158 B2
(45) Date of Patent: Jun. 19, 2012

(54) ORGANIC EL DISPLAY PANEL

(75) Inventors: Hidehiro Yoshida, Osaka (JP); Kenji Okumoto, Kyoto (JP)

(73) Assignee: Panasonic Corporation, Osaka (JP)

( * ) Notice: Subject to any disclaimer, the term of this patent is extended or adjusted under 35 U.S.C. 154(b) by 164 days.

(21) Appl. No.: 12/819,468

(22) Filed: Jun. 21, 2010

(65) Prior Publication Data

US 2010/0327297 A1  Dec. 30, 2010

(30) Foreign Application Priority Data

Jun. 24, 2009  (JP) .................................. 2009-150293

(51) Int. Cl.
  *H01L 51/50* (2006.01)
(52) U.S. Cl. ..................... 257/89; 257/98; 257/E51.021; 257/E51.022; 313/505
(58) Field of Classification Search ........... 257/E51.019, 257/E51.021, E51.022
  See application file for complete search history.

(56) References Cited

U.S. PATENT DOCUMENTS

| | | | | |
|---|---|---|---|---|
| 8,076,704 | B2 * | 12/2011 | Lee et al. ...................... | 257/294 |
| 2003/0044639 | A1 * | 3/2003 | Fukuda ......................... | 428/690 |
| 2007/0029539 | A1 | 2/2007 | Yashima et al. | |
| 2007/0057264 | A1 * | 3/2007 | Matsuda ......................... | 257/88 |
| 2007/0076141 | A1 | 4/2007 | Domoto | |
| 2008/0238295 | A1 | 10/2008 | Takei et al. | |
| 2009/0230415 | A1 | 9/2009 | Ide et al. | |
| 2010/0084968 | A1 * | 4/2010 | Watanabe et al. ............. | 313/504 |

FOREIGN PATENT DOCUMENTS

| | | |
|---|---|---|
| JP | 2003-272855 | 9/2003 |
| JP | 2005-174717 | 6/2005 |
| JP | 2005-331665 | 12/2005 |
| JP | 2007-066883 | 3/2007 |
| JP | 2007-310156 | 11/2007 |
| JP | 2008-243773 | 10/2008 |

OTHER PUBLICATIONS

Hiroshi Shirouzu, "Organic Light Emitting Display Device and Control Method Thereof", U.S. Appl. No. 12/724,901, Mar. 2010.

* cited by examiner

*Primary Examiner* — Stephen W Smoot
(74) *Attorney, Agent, or Firm* — Greenblum & Bernstein, P.L.C.

(57) ABSTRACT

An organic EL display panel comprising a substrate and an organic light-emitting element R emitting red light, an organic light-emitting element G emitting green light and an organic light-emitting element B emitting blue light which are arranged on the substrate, wherein each of the organic light-emitting element has a concavely curved pixel electrode which is a reflective electrode, a functional layer formed with coating over the pixel electrode, an organic light emitting layer arranged on the functional layer, a counter electrode which is a transparent electrode arranged over the organic light emitting layer and a bank defining the functional layer formed with coating, the element R, the element G and the element B have different amount of the functional layer and the element R, the element G and the element B have different curvature radius of the concavely curved pixel electrode.

5 Claims, 8 Drawing Sheets

ORGANIC EL DISPLAY PANEL

CROSS REFERENCE TO RELATED APPLICATIONS

The disclosure of Japanese Patent Application No. 2009-150293 filed on Jun. 24, 2009 including the specification, drawings and abstract is incorporated herein by reference in its entirety.

TECHNICAL FIELD

This invention relates to an organic EL display panel.

BACKGROUND ART

An organic EL display panel has a plurality of organic light-emitting elements arranged on a substrate. A light-emitting element has basically a pixel electrode, an organic light emitting layer and a counter electrode. In the organic light emitting layer, a hole and an electron form an electron-hole pair, and the pair acts as a light emitting exciter to make the organic light emitting layer emit light.

The light-emitting element contained in the organic EL display panel can be classified into a light-emitting element R emitting red light, a light-emitting element G emitting green light and a light-emitting element B emitting blue light. The element R, the element G and the element B in the organic EL display panel may have organic emitting layer emitting white light which is colored for each color by a color filter. On the other hand, the element R, the element G and the element B may have the organic light emitting layer emitting red light, the organic light emitting layer emitting green light and the organic light emitting layer emitting blue respectively. The light emitted from the organic light emitting layer is radiated to outside through the transparent electrode (the pixel electrode or the counter electrode). Since the light-extraction efficiency in the organic EL display panel is a few %, an improvement of the light-extraction efficiency is required.

In order to improve the light extraction efficiency, one of the pixel electrode or the counter electrode is made as a transparent electrode, and the other is made as a reflective electrode. This is to efficiently extract the emitted light from the organic light emitting layer from the transparent electrode. A part of the emitted light from the organic light emitting layer is directed to the transparent electrode; the other part of the light directed to the reflective electrode is reflected by the reflective electrode and directed to the transparent electrode. It is possible to improve the efficiency of the light extraction by preventing mutual damping of the light directed to the transparent electrode from the organic light emitting layer and the light reflected by the reflective electrode and directed to the transparent electrode.

A technology is reported for adjusting the optical distance from the organic emitting layer to the reflective electrode for preventing damping of the light to be extracted by arranging the transparent functional layer between the metal electrode which is the reflective electrode and the organic light emitting layer by sputtering or the like (refer to such as Patent Document 1).

In addition, a technology is known to adjust the film thickness of the transparent functional layer for each element to adjust the optical distance for each element (refer to Patent Documents 2 to 4). This is because in the organic EL display panel having the organic light emitting layer emitting red light, the organic light emitting layer emitting green light and the organic light emitting layer emitting blue light, the element R, element G and element B have different condition (the optical distance) for improving the light extraction efficiency.

In Patent Documents 2 to 4, the organic light emitting layer and the transparent functional layer for adjusting the optical distance are formed by sputtering, vapor-deposition technique, or the like.

A technology is also known to form the organic light emitting layer, the hole transport layer and the like by applying a solution containing the material of the organic light emitting layer and the hole transport layer and drying the solution. The area applied with the solution is defined by the separation wall (bank).

The shape profile of the functional layer formed with coating differs depending on the solute of the solution, kind of the solvent and their content ratio. For example, when each color filter film of the light-emitting element is formed with coating, the solute of the solution to be applied differs depending on color. For this reason, when the height and the taper angle of the separation wall (bank) are the same, the shape of the color filter film is liable to differ for each color. To cope with this problem, a technology is reported to change the height and the taper angle of the separation wall (bank) for each color of the color filter film for improving uniformity of the film thickness of the color filter film (refer to Patent Document 5, for example).

In addition, a technology is reported to make the shape of the pixel electrode concavely curved for improving uniformity of the film thickness of functional layer (refer to Patent Document 6 and Patent Document 7, for example).

Furthermore, a technology is reported to make the organic light emitting layer concavely curved for using efficiently the light emitted to the plane direction of the display (refer to Patent Document 8 and Patent Document 9, for example).

CITATION LIST

Patent Literature

Patent Document 1: Japanese Patent Application Laid-Open No. 2003-272855
Patent Document 2: Japanese Patent Application Laid-Open No. 2007-66883.
Patent Document 3: U.S. Patent Application Laid-Open No. 2007/0029539
Patent Document 4: U.S. Patent Application Laid-Open No. 2007/0076141.
Patent Document 5: Japanese Patent Application Laid-Open No. 2007-310156
Patent Document 6: Japanese Patent Application Laid-Open No. 2008-243773
Patent Document 7: U.S. Patent Application Laid-Open No. 2008/0238295
Patent Document 8: Japanese Patent Application Laid-Open No. 2005-331665
Patent Document 9: Japanese Patent Application Laid-Open No. 2005-174717

SUMMARY OF INVENTION

Technical Problem

As described above, in Patent Documents 2 to 4, the film thickness of the transparent functional layer which adjusts the optical distance is adjusted for each element. On the other hand, the sputtering and the vapor-deposition technique which are the means for forming the transparent functional layer disclosed in Patent Documents 2 to 4 cannot form functional films with different thickness simultaneously. For this reason, as disclosed in Patent Documents 2 to 4, when the transparent functional layer is formed by sputtering, the vapor-deposition technique or the like, in order to adjust the film thickness of the transparent layer for each element, it is necessary to prepare the transparent functional layer for each element in a separate process. For this reason, in the method described in Patent Documents 2 to 4, the number of processes becomes large, and the manufacturing cost increases.

On the other hand, with the coating method which is the other means to form the functional layer, it is possible to form the functional layer with different thickness simultaneously by adjusting the coating amount of the solution containing the functional material or the concentration of the solution containing the functional material. Therefore, it seems to be easy to adjust the thickness of the functional layer for each element, when the functional layer is formed with the coating method. However, if the amount or the concentration of the solution to be applied is changed, the shape profile of the functional layer to be formed is changed. Therefore, it is difficult to control the thickness of the functional layer appropriately in the case when the applied amount of the solution containing the functional material or the concentration of the solution containing the functional material differs.

The object of this invention is to provide an organic EL display in which the thickness of functional layer for adjusting the optical distance can be controlled appropriately, even when the functional layer is formed with the coating method.

Solution to Problem

The inventor of this invention found that, if the shape of the pixel electrode is controlled for each element depending on the amount of the functional material contained in the solution to be applied, the shape of the functional layer can be controlled appropriately, and the light extraction efficiency of the light-emitting element can be improved and completed this invention by adding further examination.

This invention relates to an organic EL display panel shown below. These organic EL display panel can be of a top emission type.

[1] An organic EL display panel comprising a substrate and an organic light-emitting element R emitting red light, an organic light-emitting element G emitting green light and an organic light-emitting element B emitting blue light which are arranged on the substrate, wherein each of the organic light-emitting element has a concavely curved pixel electrode which is a reflective electrode, a functional layer formed with coating over the pixel electrode, an organic light emitting layer arranged on the functional layer, a counter electrode which is a transparent electrode arranged over the organic light emitting layer and a bank defining the functional layer formed with coating, the element R, the element G and the element B have different amount of the functional layer and the element R, the element G and the element B have different curvature radius of the concavely curved pixel electrode.

[2] The organic EL display panel according to [1], wherein the element R, the element G and the element B have different thickness of the functional layer.

[3] The organic EL display panel according to [1], wherein the curvature radius of the pixel electrode of the element having the largest amount of the functional layer among the element R, the element G and the element B is the largest, and the curvature radius of the pixel electrode of the element having the smallest amount of the functional layer among the element R, the element G and the element B is the smallest.

[4] The organic EL display panel according to any one of [1] to [3], wherein the functional layer formed with coating is a hole transport layer.

[5] The organic EL display panel according to any one of [1] to [3], wherein the functional layer formed with coating is a hole-injection layer.

Advantageous Effects of Invention

According to this invention, although the functional layer for adjusting the optical distance is formed with the coating method, the thickness of the functional layer is appropriately controlled for each element, which result in the high light extraction efficiency for all the light-emitting element. Therefore, according to this invention, an organic EL display panel with high brightness and high contrast can be obtained. Furthermore, since the organic EL display panel of this invention can be an organic EL display panel of a coating type, growing in size of the display panel and improvement of the productivity of the panel can be realized.

DESCRIPTION OF EMBODIMENTS

Figure 1:
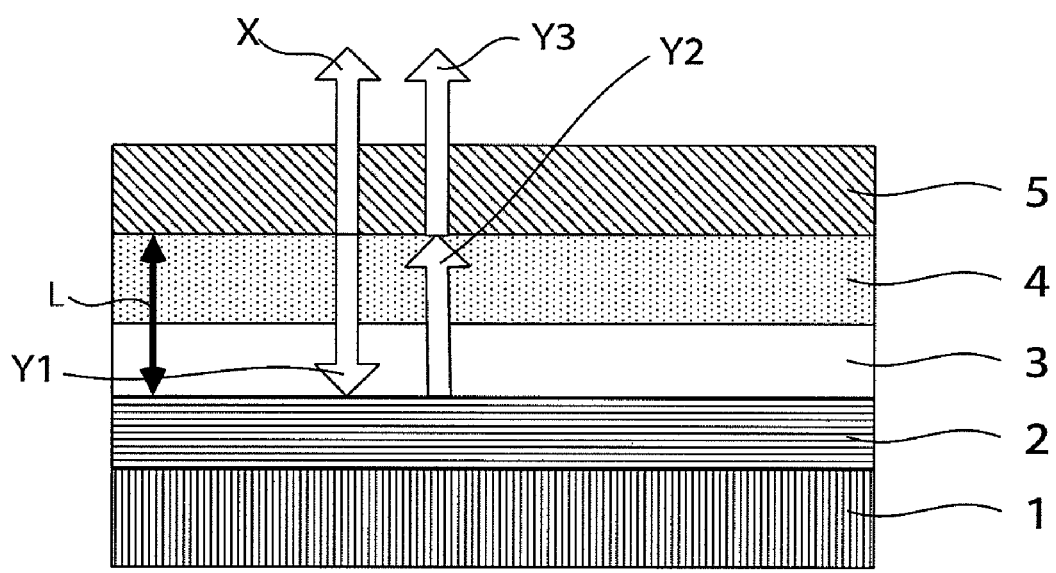
FIG. 1 is a schematic sectional view of the organic EL element included in the organic EL display panel of this invention to explain the optical distance L.

The organic EL display panel of this invention has a substrate and a plurality of light-emitting elements arranged on a substrate. The plurality of light-emitting elements include, a light-emitting element R emitting red light, a light-emitting element G emitting green light and a light-emitting element B emitting blue light. The light-emitting element R, the light-emitting element G and the light-emitting element B preferably have an organic light emitting layer with different component.

Each light-emitting element has at least a pixel electrode arranged on the substrate, an organic light emitting layer arranged over the pixel electrode and an counter electrode arranged over the organic light emitting layer. In this invention, the organic light emitting layer is preferably formed with coating. In addition, each light-emitting element has a functional layer formed with coating to adjust optical distance (described later). In addition, each organic light-emitting element has a bank for defining the organic light emitting layer and the functional layer.

The organic EL display panel of this invention is characterized in that the amount of the functional layer and the shape of the pixel electrode are controlled for each of organic light emitting elements R, G and B. The other constitution may be the same as the publicly known EL display panel so long as the effect of this invention is not damaged. For example, the organic EL display panel of this invention may be either of a bottom emission type or of a top emission type.

When the organic EL display panel is of a top emission type, the pixel electrode is the reflective electrode and the counter electrode is the transparent electrode. On the other hand, when the organic EL display panel is of a bottom emission type, the pixel electrode is the transparent electrode and the counter electrode is the reflective electrode. Examples of the reflective electrode include the metal electrode such as aluminum and silver and an alloy electrode such as APC (Ag, Pd and Cu). Examples of the transparent electrode include ITO electrode, IZO electrode and the like. Typically, the pixel electrode of the light-emitting element is an anode electrode and the counter electrode is a cathode electrode.

The substrate is not limited particularly, and is for example a glass substrate or the like. In addition, the substrate may have a thin-film transistor (a driving TFT). The source of the thin-film transistor (TFT) or the drain electrode may be connected to the pixel electrode (described later) of the light-emitting element.

The pixel electrode is a conductive layer arranged on the substrate. On the pixel electrode, a hole-injection layer consisting of oxides of a transition metal (for example, tungsten oxides) may be arranged.

This invention is characterized in that the pixel electrode is concavely curved. Since the layer formed with coating over the pixel electrode (the functional layer and the organic light emitting layer) usually has concavely curved shape (refer to FIG. 2), it is possible to make the film thickness of the layer formed with coating on the pixel electrode uniform by making the pixel electrode concavely curved. In addition, this invention is characterized in that the light emitting elements R, G and B have different curvature radius of the concavely curved pixel electrode. The specific curvature radius of the pixel electrode and the reason why the light emitting elements R, G and B have different curvature radius of the concavely curved pixel electrode will be described later. The concavely curved pixel electrode means that, among the surface of the pixel electrode, the surface part contacting the functional layer (described later) is curved and the center part of the surface part contacting the functional layer is dented toward the substrate.

In order to make the pixel electrode concavely curved, for example, it is advised to form a concavely curved part on the substrate and to form the pixel electrode on the concavely curved part. In order to form a concavely curved part on the substrate, the substrate may be subjected to direct wet etching or dry etching, or the light-sensitive resin layer may be arranged on the face where the concavely curved part is to be formed, then exposing the light-sensitive resin layer to light and developing the exposed light-sensitive resin layer (refer to FIG. 7).

The functional layer is a layer formed with coating between the reflective electrode and the organic light emitting layer to control the optical distance between the reflective electrode and the organic light emitting layer. As just described, this invention is characterized in that the optical distance between the reflective electrode and the organic light emitting layer is controlled by the functional layer formed with coating.

As described above, since the functional layer is a layer formed with coating between the reflective electrode and the organic light emitting layer, the functional layer could be different kinds of layers depending on whether the organic EL display panel is a top emission type or a bottom emission type.

When the organic EL display panel is of a top emission type, since the reflective electrode is usually the pixel electrode, examples of the functional layer include a hole transport layer called an inter-layer, a hole-injection layer including PEDOT-PSS and the like arranged between the organic light emitting layer and the pixel electrode. Furthermore, the functional layer may be a transparent conductive film (a coating type ITO film and the like), when the transparent conductive film is formed with coating. The functional layer is preferably a hole transport layer (an inter-layer). This is because the light-emitting property of a light-emitting element is hardly influenced by the thickness change of the hole transport layer.

The hole transport layer plays a role to block the intrusion of an electron into the hole-injection layer and to transfer a hole efficiently to the organic light emitting layer. Examples of the material of the hole transport layer formed with coating include polyfluorene, polyvinyl carbazole and derivatives thereof, polysilane and derivatives thereof, polysiloxane derivatives having aromatic amine in the side chain or in the main chain, pyrazoline derivatives, arylamine derivatives, stilbene derivatives, triphenyldiamine derivatives, polyaniline and derivatives thereof, polythiophene and derivatives thereof, polyarylamine and derivatives thereof, polypyrrole and derivatives thereof, poly (p-phenylenevinylene) and derivatives thereof and poly (2,5-thienylenevinylene) and derivatives thereof and the like. The material of the hole transport layer formed with coating is preferably a copolymer of polyfluorene and triphenylamine derivatives.

On the other hand, when the organic EL display panel is of a bottom emission type, since the reflective electrode is usually the counter electrode, examples of the functional layer include an electron transfer layer, a transparent conductive film and the like (a coating type ITO film or the like) which can be formed with coating arranged between the organic light emitting layer and the counter electrode.

The organic EL display panel of this invention is characterized in that the thickness of the functional layer is adjusted for each of organic light emitting elements R, G and B, in order to adjust the optical distance between the reflective electrode and the organic light emitting layer for each of organic light emitting elements R, G and B appropriately. Therefore, according to this invention, the organic light emitting elements R, G and B have different film thickness of the functional layer. Referring to drawings, the reason for controlling the thickness of the functional layer for each of organic light emitting elements R, G and B will be explained below.

In FIG. 1, a light-emitting element of a top emission type arranged on substrate 1 is shown. As shown in FIG. 1, the organic light-emitting element has substrate 1, reflective electrode 2, functional layer 3 formed with coating, organic light emitting layer 4 of each color, and transparent electrode 5. Needless to say, the other constitutional members may be included in the organic light-emitting element.

As shown in FIG. 1, when organic light emitting layer 4 emits light, a part of the light directing to transparent electrode 5 (refer to X) emitted from organic light emitting layer 4 passes through transparent electrode 5. On the other hand, the other part of the light directed to reflective electrode 2 (refer to Y1) is reflected by reflective electrode 2, directed to transparent electrode 5 passing through organic light emitting layer 4 (refer to Y2), and passes through transparent electrode 5. At this time, if the light indicated as X and the light indicated as Y3 can strengthen mutually, the light extraction efficiency through transparent electrode 5 is improved.

The condition for the mutual strengthening of the light indicated as X and the light indicated as Y3 depends on the wavelength λ of the light emitted from organic light emitting layer 4 and the optical distance L from organic light emitting layer 4 to reflective electrode 2. The optical distance L depends on "thickness" and "refractive index" of organic light emitting layer 4 and a layer between the organic light emitting layer and the reflective electrode (in FIG. 1, functional layer 3 alone) respectively. More concretely, the optical distance L can be calculated by the following formula.

(Equation 1)

$$L = \sum_i n_i d_i \quad [1]$$

di (i=1, 2, 3 . . . ) represents "thickness" of the organic light emitting layer and each layer between the organic light emitting layer and the reflective electrode. ni (i=1, 2, 3 . . . ) represents "refractive index" of an organic light emitting layer and each layer between the organic light emitting layer and the reflective electrode.

When the optical distance L calculated by the above mathematical formula meets the following relationship with the wavelength λ of the light emitted from the organic light emitting layer, the light indicated as X and the light indicated as Y3 in FIG. 1 can be mutually strengthened.

(Equation 2)

$$L = \frac{2n+1}{4}\lambda \quad (n = 0, 1, 2, \dots) \quad [2]$$

As described before, in the organic EL display panel of this invention, the organic light emitting elements R, G and B have different light emitting component. The wavelength $\lambda_R$ of the light emitted from the organic light emitting layer R, the wavelength $\lambda_G$ of the light emitted from the organic light emitting layer G and the wavelength $\lambda_B$ of the light emitted from the organic light emitting layer B are different from each other. Therefore, organic light emitting elements R, G and B have different optical distance L with which the light indicated as X and the light indicated as Y3 can be mutually strengthened.

As described above, in the organic EL display panel of this invention, by adjusting the thickness of the functional layer for each of organic light emitting elements R, G and B, it is possible to adjust the optical distance L of the light-emitting element for each of organic light emitting elements R, G and B, which result in the increased light extraction efficiency from each light-emitting element. Therefore, in the organic EL display panel of this invention, the organic light emitting elements R, G and B have different thickness of the functional layer.

For adjusting the thickness of the functional layer formed with coating, it is advised to adjust the amount of the material of the functional layer (also referred to as simply "functional material" hereinafter) to be supplied. For adjusting the amount of the functional material to be supplied, the concentration of the functional material in the material solution of the functional layer (also referred to as simply "functional material solution" hereinafter) may be adjusted while keeping the amount of the functional material solution constant; or the amount of the functional material solution may be adjusted while keeping the concentration of the functional material in the functional material solution constant.

When the concentration of the functional material in the functional material solution is controlled, since the same amount of the functional material solution can be applied to the application area of each light-emitting element, leaking of the functional material solution from the application area can be prevented.

On the other hand, when the amount of the functional material solution to be applied is controlled, since only one kind of the functional material solution should be prepared, the amount of the functional material to be supplied can be adjusted easily.

Figure 2A:
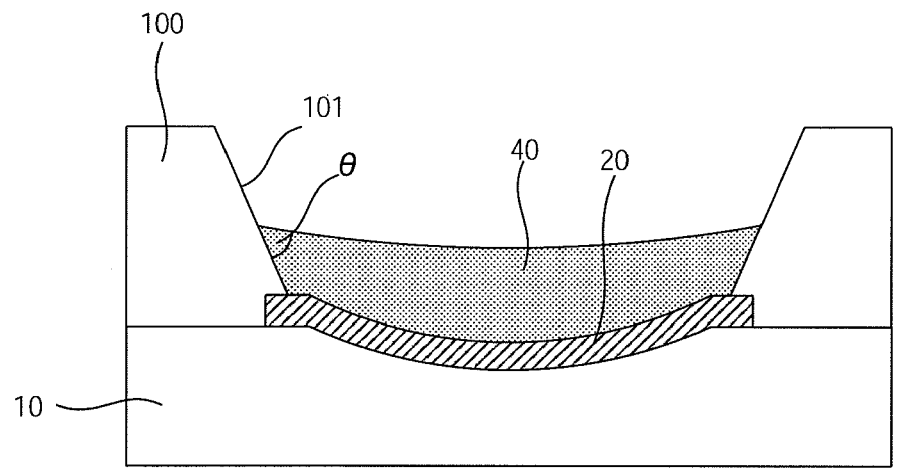
FIG. 2A and FIG. 2B are figures that show the relationship between the amount of the functional material included in a solution of the functional material and the shape of the functional layer to be formed.

The amount of the functional material to be supplied significantly affects the shape of the functional layer. Although the relationship between the amount of the functional material and the shape of the functional layer (for example, uniformity of the film thickness) is not always determined definitely, for example, as shown in FIG. 2A, if the amount of the functional material to be supplied to the application area defined by bank 100 is large, the contact angle θ of inclined surface 101 of the bank with functional layer 40 becomes large, and the functional layer becomes relatively flat (the curvature radius of the surface of the functional layer becomes large).

Figure 2B:
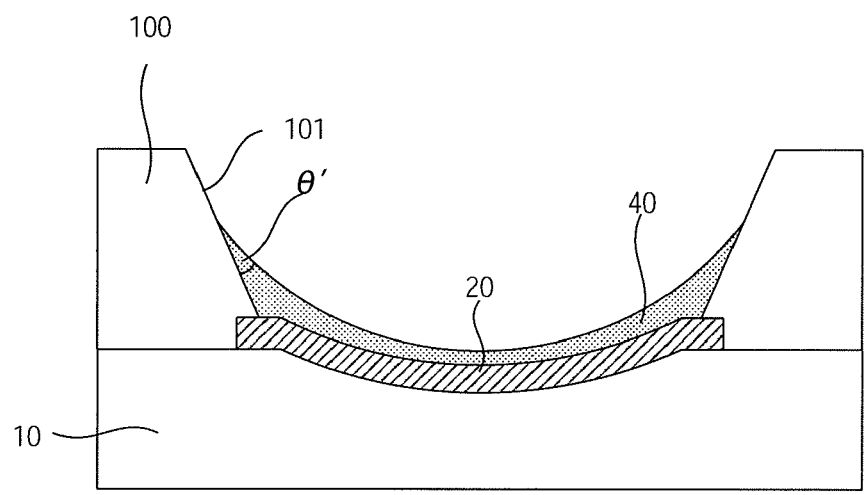

On the other hand, as shown in FIG. 2B, if the amount of the functional material to be supplied to the application area defined by bank 100 is small, the contact angle θ' of inclined surface 101 of bank 100 with functional layer 40 becomes small, and the dent of the surface of the functional layer becomes deep (the curvature radius of the surface of the functional layer becomes small).

Therefore, when the shape of the pixel electrodes is the same, if the amount of the functional material to be supplied is changed, there is a risk that the thickness of the functional layer becomes nonuniform.

This difference of the contact angle θ is due to the difference of the contact angle of the functional material solution with the bank at pinning. In the case when the amount of the functional material to be supplied is large, the contact angle of the functional material solution with the bank at pinning becomes large. On the other hand, in the case when the amount of the functional material to be supplied is small, the contact angle of the functional material solution with the bank at pinning becomes small.

Figure 3A:
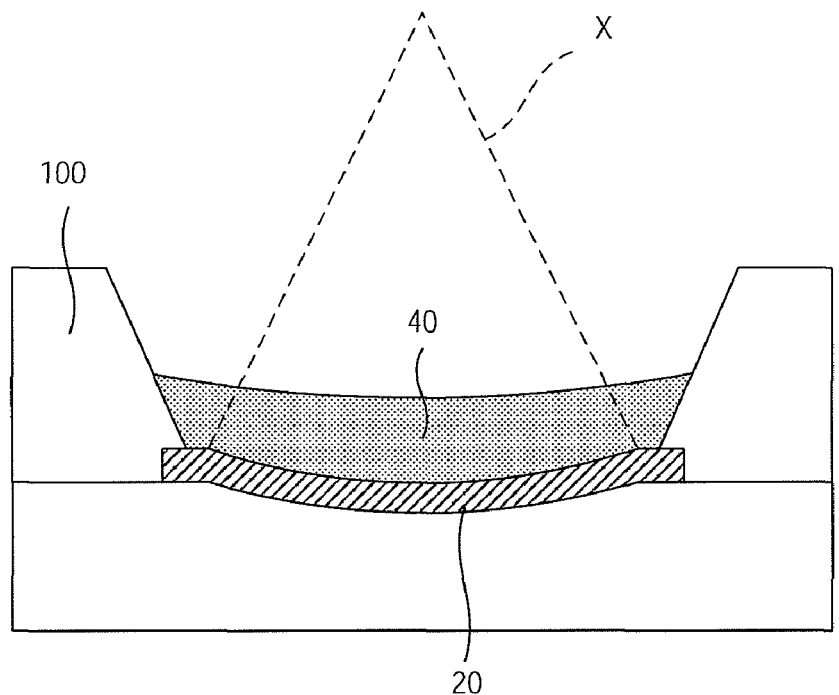
FIG. 3A and FIG. 3B are figures that show the relationship among the amount of the functional material included in a solution of the functional material, the shape of the functional layer and the shape of the pixel electrode.
Figure 3B:
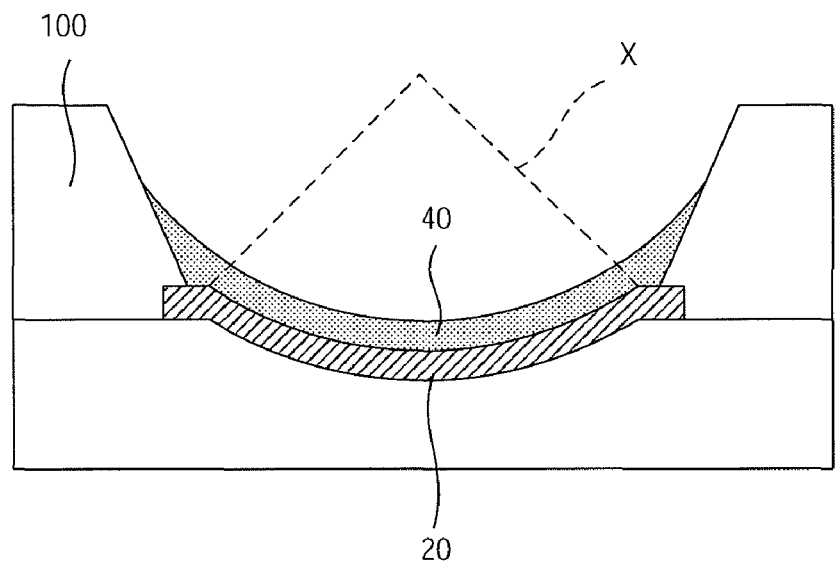

As described above, this invention is characterized in that the variation of the film thickness of the functional layer is corrected by adjusting the curvature radius of the concavely curved pixel electrode for each element. More concretely, when the amount of the functional material to be supplied is large, as shown in FIG. 3A, since the curvature radius of the surface of functional layer 40 becomes large, the curvature radius X of pixel electrode 20 is increased. On the other hand, when the amount of the functional material to be supplied is small, as shown in FIG. 3B, since the curvature radius of the surface of functional layer 40 becomes small, the curvature radius X of pixel electrode 20 is decreased. By adjusting the curvature radius of the pixel electrode depending on the amount of the functional material to be supplied, the film thickness of the functional layer in the light-emitting element becomes uniform, even if the shape of each functional layer to be formed is different.

The amount of the functional material to be supplied is adjusted for each of organic light emitting elements R, G and B in order to adjust the thickness of the functional layer for each of organic light emitting elements R, G and B for the purpose of setting the optical distance L between the reflective electrode and the organic light emitting layer for each of organic light emitting elements R, G and B appropriately. Furthermore, depending on the amount the functional material to be supplied, the curvature radius of the pixel electrode is adjusted for each of organic light emitting elements R, G and B. As a result, the organic light emitting elements R, G and B have different amount of the functional layer and different curvature radius of the pixel electrode.

Figure 4:
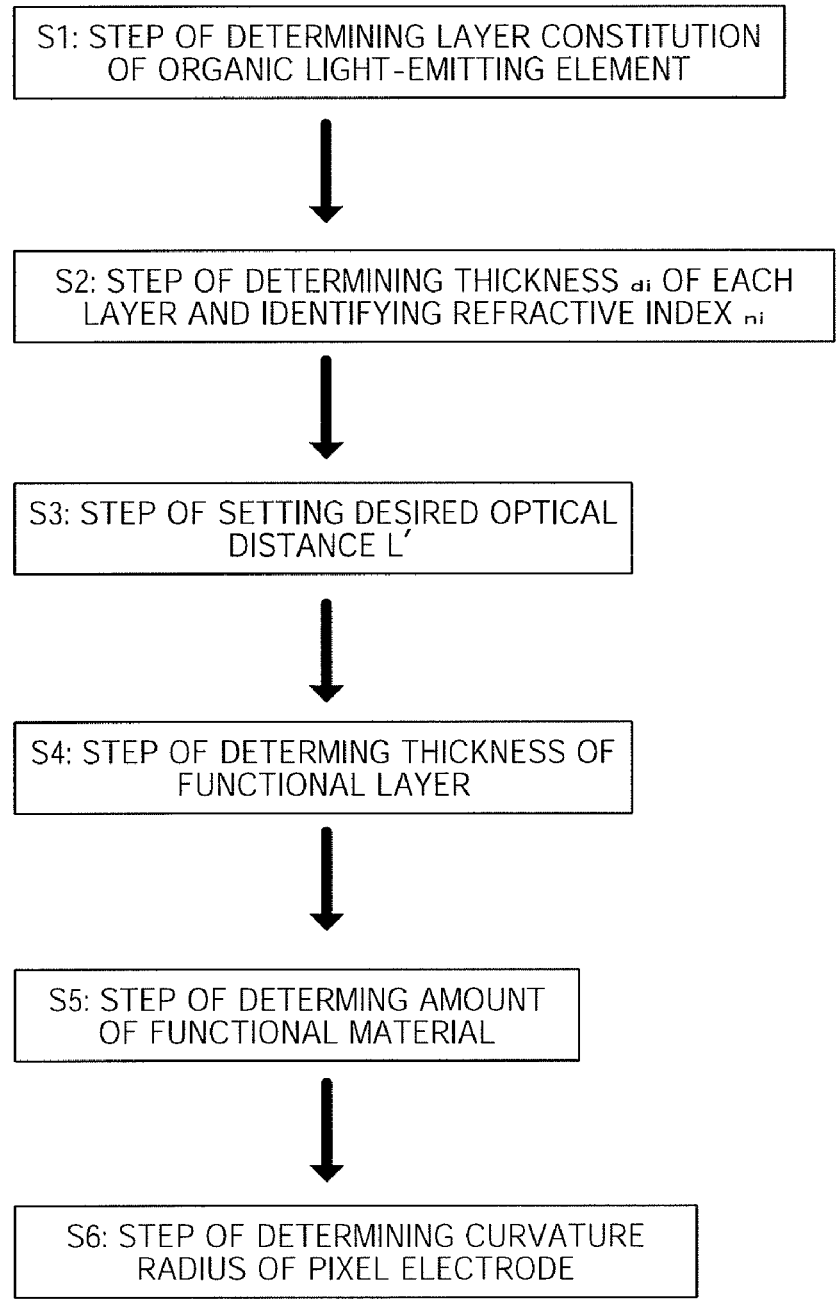
FIG. 4 is a figure showing a flow of the designing process of the light-emitting element contained in the organic EL display panel of this invention.

Next, the flow of the designing process of each organic light-emitting element in the organic EL display panel of this invention will be explained by referring to FIG. 4.

First, the layer constitution of the organic light-emitting element is determined (S1). The organic light-emitting element include at least the pixel electrode, the organic light emitting layer and the counter electrode. One of the pixel electrode and the counter electrode is set as the reflective electrode, and the other is set as the transparent electrode. Between the organic light emitting layer and the reflective electrode, a functional layer is formed with coating. The optical distance L between the reflective electrode and the organic light emitting layer is adjusted by the thickness of the functional layer.

After the layer constitution of the organic light-emitting element is determined, the thickness of layers other than the functional layer for adjusting the optical distance is determined. Particularly, it is important to determine the film thickness of the organic light emitting layer, each layer present between the organic light emitting layer and the reflective electrode. In addition, the refractive index of the organic light emitting layer, each layer present between the organic light emitting layer and the counter electrode are identified (S2).

Then, the wavelength λ of the light emitted from the organic light emitting layer is identified. The emission wavelength λ of the light from the organic light emitting layer depends on the organic light emitting material. As described before, since the optical distance L is required to meet the formula described below for increasing the light extraction efficiency, a desired optical distance L' to meet the following formula is determined (S3).

(Equation 3)

$$L' = \frac{2n+1}{4}\lambda \ (n = 0, 1, 2, \ldots) \quad [3]$$

Then, the thickness of the functional layer is determined to meet the optical distance L'. Since the thickness of each layer other than the functional layer is predetermined, the thickness of the functional layer can be determined by applying the thickness and the refractive index of each layer other than the functional layer to the following formula (S4).

(Equation 4)

$$L' = \sum_i n_i d_i \quad [4]$$

After the thickness of the functional layer is determined, the amount of the functional material required for forming the functional layer of the thickness is determined (S5). And depending on the amount the functional material required, the amount of the functional material solution and the concentration of the functional material in the functional material solution to be applied may be adjusted.

By forecasting drying pattern of the functional material solution, based on the amount of the functional material to be supplied, the surface free energy of the bank defining the application area and the like, the curvature radius of the pixel electrode is determined (S6). Generally, as described above, the curvature radius of the pixel electrode is made large as the amount of the functional material to be supplied is increased; and the curvature radius of the pixel electrode is made small as the amount of the functional material to be supplied is decreased.

This process is conducted for the light-emitting element R, the light-emitting element G and the light-emitting element B, respectively.

For determining the thickness of the functional layer M, the organic EL device simulator setfos (semiconducting emissive thin film optics simulator) may be used.

More specific configuration example of the light-emitting element of a top emission type are shown below.

Pixel electrode: APC electrode
Hole-injection layer: tungsten oxides (WOx), film thickness $d_1$(=100 nm), refractive index $n_1$
Hole transport layer (interlayer): polyaniline, film thickness $d_2$, refractive index $n_2$
Organic light emitting layer: polyfluorene emitting red light, green light or blue light (emission wavelength λ), film thickness $d_3$(=50 nm), refractive index $n_3$
Counter electrode: ITO electrode Since the hole-injection consists of tungsten oxide is formed at once for each light emitting element by sputtering or the like, it is difficult to change the film thickness for each element. Since the organic light emitting layer is formed by the coating method (the ink-jet printing method), it is possible to change the film thickness for each element. However, the film thickness of the organic light emitting layer significantly affects the light emitting efficiency and the life of the element. Therefore, the freedom of changing the film thickness of the organic light emitting layer is strictly restricted. Therefore, it is difficult to use the organic light emitting layer as the functional layer for adjusting the optical distance.

Therefore, the hole transport layer formed with coating is used as the functional layer to adjust the optical distance.

The optical distance L is calculated by the formula, $L=n_1d_1+n_2d_2+n_3d_3$. In addition, when the optical distance L meet the relationship, $L=(2n+1)\lambda/4$, the light extraction efficiency is increased. Therefore, the thickness $d_2$ of the hole transport layer is determined so that d2 meets both conditions.

Figure 5:
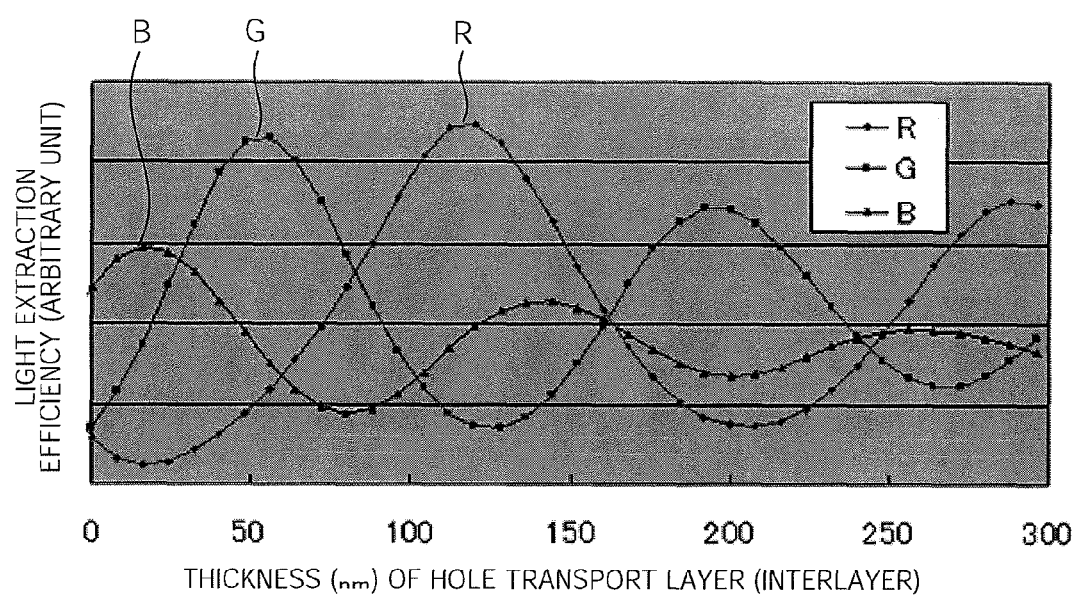
FIG. 5 is a graph showing the relationship between the light extraction efficiency and the thickness of the hole transport layer.

The analytical results of the organic EL device simulator setfos are shown in the graph of FIG. 5. The vertical axis indicates the light extraction efficiency and the horizontal axis indicates the film thickness $d_2$ of the hole transport layer.

As shown in the graph of FIG. 5, it is understood that the organic light emitting elements R, G and B have different optimum film thickness $d_2$. For example, the light extraction efficiency of the element R is high, when the thickness of the hole transport layer is approximately 120 nm; the light extraction efficiency of the element G is high, when the thickness of the hole transport layer is approximately 56 nm; and the light extraction efficiency of the element B is high, when the thickness of the hole transport layer is approximately 16 nm.

In the case where the thickness of the hole-injection layer is changed from 100 nm to 180 nm in order to decrease the film thickness of the hole transport layer of the element, the light extraction efficiency becomes high when the hole transport layer is 18 nm, 90 nm and 34 nm for the element R, the element G and the element B, respectively. Thus, it is necessary to adjust the thickness of the hole transport layer.

Needless to say, in the case when the other layer is added between the organic light emitting layer and the reflective pixel electrode, it is necessary to adjust the thickness of the hole transport layer accordingly.

From the calculated film thickness of the hole transport layer, the amount and the concentration of the applied material to form the hole transport layer are determined, and the shape of the hole transport layer to be formed is forecasted. The curvature radius of the pixel electrode is then determined according to the forecasted shape of the hole transport layer. Thus, the optical distance is adjusted, and the organic EL display panel with a high light extraction efficiency can be obtained.

The embodiment of this invention will be explained referring to drawings below.

Embodiment 1

Figure 6:
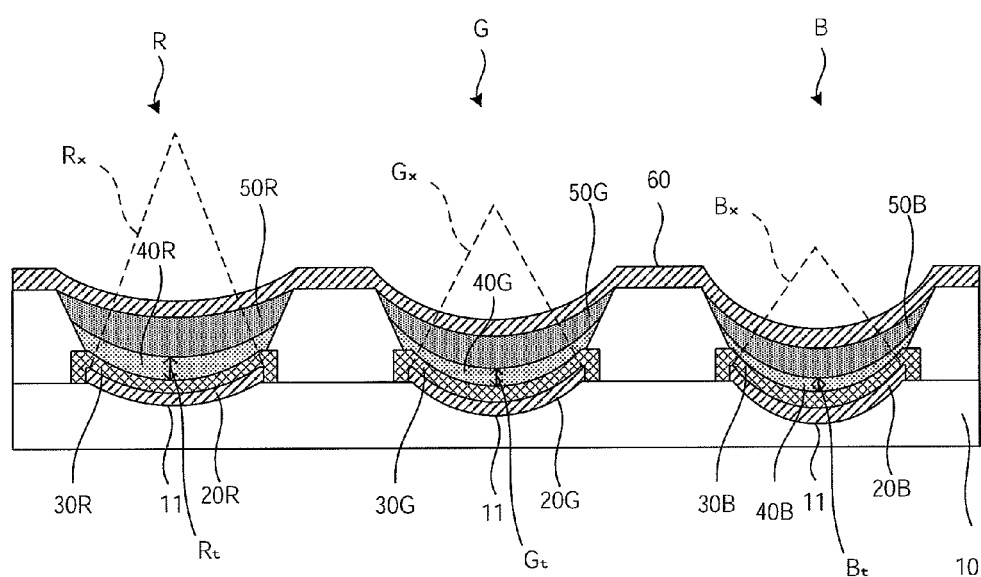
FIG. 6 is a sectional view showing the organic EL display panel of Embodiment 1.

FIG. 6 shows the organic EL display panel of Embodiment 1. In FIG. 6, the cross-sections of the organic light-emitting element R, the organic light-emitting element G and the organic light-emitting element B in the organic EL display panel of Embodiment 1 are shown. Each light-emitting element is arranged on substrate 10; and has pixel electrode 20 (20R, 20G and 20B) which is the reflective electrode, hole-injection layer 30 arranged on pixel electrode 20, hole transport layer 40 (40R, 40G and 40B) formed with coating on hole-injection layer 30, organic light emitting layer 50 (50R, 50G and 50B) arranged on hole transport layer 40 and counter electrode 60 which is a transparent electrode arranged on the organic light emitting layer. Organic light emitting layer 50R contained in the light-emitting element R emits red light, organic light emitting layer 50G contained in the light-emitting element G emits green light and organic light emitting layer 50B contained in the light-emitting element B emits blue light.

Substrate 10 has a plurality of concavely curved parts 11. On the concavely curved part 11, concavely curved pixel electrode 20 is arranged. As shown in FIG. 6, the pixel electrode 20R, pixel electrode 20G and pixel electrode 20B have different curvature radius X (Bx, Gx and Rx) such that the Bx, Gx and Rx meet following formula (1).

$$Bx<Gx<Rx< \tag{1}$$

Hole-injection layer 30 consists of oxide of a transition metal such as tungsten oxide or the like, and is formed by sputtering or the like.

Hole transport layer 40 (40R, 40G and 40B) and organic light emitting layer 50 (50R, 50G and 50B) of each organic light-emitting element are formed with coating and are defined by bank 100.

In addition, hole transport layer 40R, hole transport layer 40G and hole transport layer 40B are different in their film thickness, and also different in the amount of their material. More concretely, the film thickness Rt of hole transport layer 40R, the film thickness Gt of hole transport layer 40G and the film thickness Bt of hole transport layer 40B meet the following formula (2), $$Bt<Gt<Rt \tag{2}$$

As just described, by controlling the thickness of the hole transport layer for each of organic light emitting elements R, G and B, the optical distance of each organic light-emitting element can be adjusted. In this way, an organic EL display panel with a high light extraction efficiency can be provided. In addition, by controlling the curvature radius of the pixel electrode for each of organic light emitting elements R, G and B, even when the amount of the hole transport material to be supplied differs for each of organic light emitting elements R, G and B, a hole transport layer having uniform film thickness can be formed.

Next, a preferable manufacturing process of the organic EL display panel of Embodiment 1 will be explained. The preferable manufacturing process of the organic EL display panel of Embodiment 1 comprises: 1) a first step of providing the substrate (FIG. 7A); 2) a second step of forming two or more concavely curved parts on the substrate (FIG. 7B and FIG. 7C); 3) a third step of forming a pixel electrode on the concavely curved part of the substrate (FIG. 7D); 4) a forth step of forming a hole-injection layer on the pixel electrode (FIG. 7E); 5) a fifth step of forming a bank on the substrate (FIG. 7F); 6) a sixth step of forming a functional layer by applying a material solution of the functional layer to the area defined by the bank (FIG. 7G and FIG. 7H); 7) a seventh step of forming an organic light emitting layer on the functional layer (FIG. 7H and FIG. 7I); 8) an eighth step of forming a cathode on the organic light emitting layer (FIG. 7I).

Figure 7A:
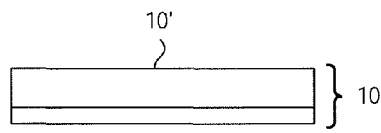
FIG. 7A to FIG. 7I are figures that show a flow of the manufacturing method of the organic EL display panel of the embodiment 1.

FIG. 7A shows the first step. In the first step, substrate 10 is provided. Substrate 10 has light-sensitive resin layer 10'. Substrate 10 may have a built-in driving TFT.

Figure 7B:
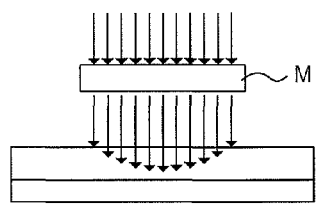
Figure 7C:
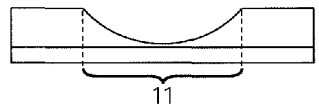

FIG. 7B and FIG. 7C show the second step. In the second step, concavely curved part 11 is formed on substrate 10. To form concave curve part 11 on substrate 10, it is advised to use a positive type photoresist as the material of the light-sensitive resin layer 10' of substrate 10, and to expose light-sensitive resin layer 10' by using a mesh mask M whose aperture near the center is larger than that of the outside as shown in 7B. Then, by developing substrate 10, substrate 10 on which concavely curved part 11 is formed can be obtained. In addition, by adjusting the curvature radius of concavely curved part 11, the curvature radius of pixel electrode 20 can be adjusted. To adjust the curvature radius of concavely curved part 11, the aperture of the mask M is adjusted.

Figure 7D:
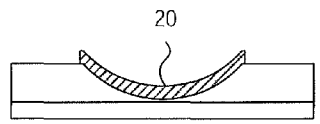

FIG. 7D shows the third step. In the third step, pixel electrode 20 is formed on concavely curved part 11 of substrate 10. Pixel electrode 20 is formed, for example, by forming a layer consisting of the material of pixel electrode 20 by sputtering or the like on concavely curved part 11 of the substrate, and by patterning the formed layer by etching. As just described, by forming pixel electrode 20 on concavely curved part 11, concavely curved pixel electrode 20 can be obtained.

Figure 7E:
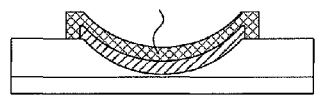

FIG. 7E shows the fourth step. In the fourth step, hole-injection layer 30 is formed on pixel electrode 20. Hole-injection layer 30 may be formed, for example, by forming a layer consisting of the material of hole-injection layer 30 by sputtering or the like, and by patterning the formed layer by etching.

Figure 7F:
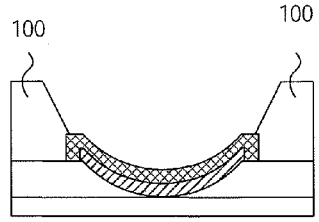

FIG. 7F shows the fifth step. In the fifth step, bank 100 is formed. Bank 100 can be formed by using the photolithography technology or the printing technology.

Figure 7G:
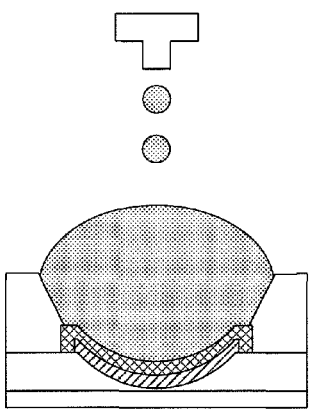
Figure 7H:
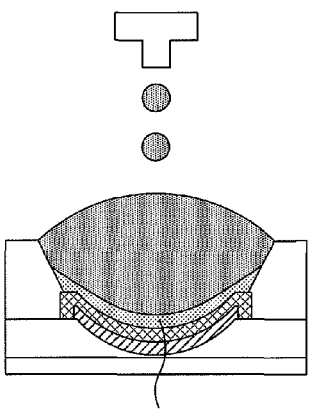
Figure 7I:
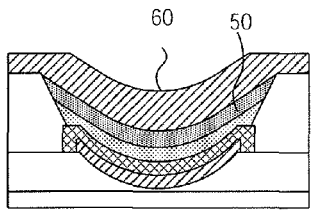

FIG. 7G and FIG. 7H show the sixth step. In the sixth step, hole transport layer 40 is formed on hole-injection layer 30. Hole transport layer 40 is formed by applying the material solution (for example, an organic solvent containing polyaniline) of the hole transport layer to an area defined by bank 100 (FIG. 7G) and drying the applied material solution. The method for applying the material solution is not particularly limited. Examples of the coating method include ink-jet, dispenser, nozzle-coating, spin-coating, intaglio printing, anastatic printing and the like. The preferable coating method is ink-jet.

Hole transport layer 40 formed by drying the material solution has a concave curve shape. In addition, the shape (curvature radius) of hole transport layer 40 differs depending on the amount of the hole transport material to be supplied. As described above, since the curvature radius of concavely curved pixel electrode 20 is adjusted in accordance with the shape of hole transport layer 40, hole transport layer 40 with uniform film thickness is obtained.

FIG. 7H and FIG. 7I show the seventh step. In the seventh step, organic light emitting layer 50 is formed on hole transport layer 40. Organic light emitting layer 50 is formed by applying the material solution of the organic light emitting layer on hole transport layer 40 (FIG. 7H) and drying the applied material solution.

FIG. 7I shows the eighth step. In the eighth step, counter electrode 60 is formed on organic light emitting layer 50. Counter electrode 60 is formed, for example, by vapor-deposition technique or sputtering. Then, a sealing film for preventing the intrusion of water and oxygen may be formed on the counter electrode.

Embodiment 2

Figure 8:
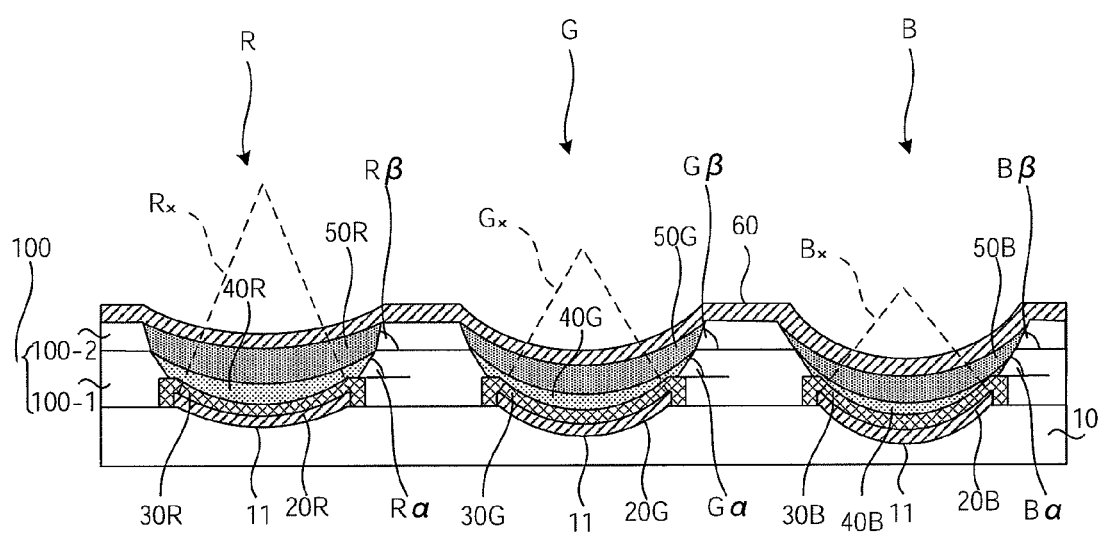
FIG. 8 is a sectional view to show the organic EL display panel of Embodiment 2.

In Embodiment 2, an embodiment in which the bank consisting of two layers will be explained. FIG. 8 shows the organic EL display panel of Embodiment 2. In FIG. 8, the cross-section of each organic light-emitting element of the organic EL display panel of Embodiment 2 is shown. The organic EL display of Embodiment 2 has a similar layer constitution to that of the organic EL display of Embodiment 1 described before. The organic EL display has pixel electrode 20 (20R, 20G and 20B), hole-injection layer 30, hole transport layer 40 (40R, 40G and 40B), organic light emitting layer 50 (50R, 50G and 50B) and counter electrode 60. Further, the thickness and the material amount of hole transport layers 40R, 40G and 40B, and the curvature radius X of pixel electrodes 20R, 20B and 20C are different each other.

As shown in FIG. 8, in Embodiment 2, bank 100 is a two layered bank including lower layer bank 100-1 and upper bank 100-2. Lower layer bank 100-1 mainly defines hole transport layer 40; and upper bank 100-2 mainly defines organic light emitting layer 50.

The taper angle of lower layer bank 100-1 (Rα, Gα and Bα) may be the same for each of organic light-emitting elements R, G and B. On the other hand, the organic light-emitting elements R, G and B have preferably different taper angle of upper layer bank 100-2 (Rβ, Gβ and Bβ). By adjusting the taper angle β of upper layer bank 100-2 for each of organic light emitting elements R, G and B, and by changing the taper angle β of upper layer bank 100-2 for each of organic light emitting elements R, G and B, the film thickness of organic light emitting layer 50 formed with coating can be made uniform.

As described above, organic light emitting layers 50 R, 50 G and 50 B of the organic EL display are also different in its component of the material. Therefore, the physical property of a solution (for example, viscosity) containing each organic light emitting material is different. If the physical property of a solution containing each organic light emitting material is different, the contact angle of the formed organic light emitting layer with the inclined surface of the bank is different. Therefore, in the case when the taper angle β of upper layer bank 100-2 defining organic light emitting layer 50 is the same for each of organic light emitting elements R, G and B, there is a risk that the film thickness of the organic light emitting layer becomes nonuniform.

On the other hand, as in this embodiment, if bank 100 is made as a two layered bank, and the taper angle β of upper bank 100-2 is adjusted for each of organic light emitting elements R, G and B, it is possible to make uniform the film thickness of organic light emitting layer 50 formed with coating.

INDUSTRIAL APPLICABILITY

According to this invention, an organic EL display panel with high brightness and high contrast can be obtained by the coating method.

REFERENCE SIGNS LIST

1 Substrate
2 Reflective electrode
3 Functional layer formed with coating
4 Organic light emitting layer
5 Transparent electrode
10 Substrate
10' Light-sensitive resin layer
11 Concave curve part
20 Pixel electrode
30 Hole-injection layer
40, 40 R, 40 G and 40 B: hole transport layer
50, 50 R, 50 G and 50B: organic light emitting layer
60 Counter electrode
100 Bank
101 Taper face of the bank
100-1 Lower layer bank
100-2 Upper layer bank
R Light-emitting element emitting red light
G Light-emitting element emitting green light
B Light-emitting element emitting blue light
M mask

The invention claimed is:

1. An organic EL display panel, comprising:
a substrate; and
a plurality of organic light-emitting elements including an element R emitting red light, an element G emitting green light and an element B emitting blue light which are arranged on the substrate, wherein
each of the plurality of organic light-emitting elements has a concavely curved pixel electrode which is a reflective electrode, a functional layer formed with a coating over the pixel electrode, an organic light emitting layer arranged on the functional layer, a counter electrode which is a transparent electrode arranged over the organic light emitting layer and a bank defining the functional layer formed with the coating,
the element R, the element G and the element B have different amounts of the functional layer, and the element R, the element G and the element B have different curvature radii of the concavely curved pixel electrode.

2. The organic EL display panel according to claim 1, wherein
the element R, the element G and the element B have different thicknesses of the functional layer.

3. The organic EL display panel according to claim 1, wherein
a curvature radius of the pixel electrode of the one of the plurality of organic light-emitting elements having the largest amount of the functional layer among the element R, the element G and the element B is a largest of the curvature radii, and
a curvature radius of the pixel electrode of the one of the plurality of organic light-emitting elements having the smallest amount of the functional layer among the element R, the element G and the element B is a smallest of the curvature radii.

4. The organic EL display panel according to claim 1, wherein the functional layer formed with the coating is a hole transport layer.

5. The organic EL display panel according to claim 1, wherein the functional layer formed with the coating is a hole-injection layer.

* * * * *